United States Patent
Chen

(10) Patent No.: US 10,785,571 B2
(45) Date of Patent: Sep. 22, 2020

(54) SPEAKER CAPABLE OF ACTIVE COOLING

(71) Applicant: Tymphany Acoustic Technology (Huizhou) Co., Ltd., Huizhou, Guangdong Province (CN)

(72) Inventor: Zhiwen Chen, Huizhou (CN)

(73) Assignee: Tymphany Acoustic Technology (Huizhou) Co., Ltd., Huizhou, Guangdong Province (CN)

( * ) Notice: Subject to any disclaimer, the term of this patent is extended or adjusted under 35 U.S.C. 154(b) by 0 days.

(21) Appl. No.: 16/407,816

(22) Filed: May 9, 2019

(65) Prior Publication Data

US 2019/0349688 A1 Nov. 14, 2019

(30) Foreign Application Priority Data

May 10, 2018 (CN) .......................... 2018 1 0442554

(51) Int. Cl.
| | | |
|---|---|---|
| *H04R 9/02* | (2006.01) | |
| *H01L 23/467* | (2006.01) | |
| *H04R 9/06* | (2006.01) | |
| *H01L 35/32* | (2006.01) | |
| *H01L 35/00* | (2006.01) | |
| *H04R 1/28* | (2006.01) | |

(52) U.S. Cl.
CPC ........... *H04R 9/022* (2013.01); *H01L 23/467* (2013.01); *H04R 9/025* (2013.01)

(58) Field of Classification Search
None
See application file for complete search history.

(56) References Cited

U.S. PATENT DOCUMENTS

| | | | | |
|---|---|---|---|---|
| 6,390,231 B1* | 5/2002 | Howze | ................... | H04R 9/022 |
| | | | | 181/148 |
| 7,319,772 B2* | 1/2008 | Chang | ...................... | H04R 1/22 |
| | | | | 181/151 |
| 2008/0304694 A1* | 12/2008 | Hayashi | ................. | H04R 9/022 |
| | | | | 381/397 |
| 2012/0163637 A1* | 6/2012 | Chen | ........................ | H04R 1/24 |
| | | | | 381/184 |
| 2012/0224740 A1* | 9/2012 | Chen | ...................... | H04R 9/025 |
| | | | | 381/433 |
| 2016/0073201 A1* | 3/2016 | Jiang | ........................ | H04R 1/22 |
| | | | | 381/394 |
| 2016/0212543 A1* | 7/2016 | Kochendoerfer | ...... | H04R 9/022 |
| 2019/0166431 A1* | 5/2019 | Hare | ...................... | H04R 9/022 |

* cited by examiner

*Primary Examiner* — Qin Zhou
(74) *Attorney, Agent, or Firm* — Muncy, Geissler, Olds & Lowe, P.C.

(57) ABSTRACT

A speaker capable of active cooling includes a basin frame, and a vibration system and a magnetic circuit system accommodated in the basin frame. The vibration system includes a diaphragm and a voice coil fixed on the diaphragm through a top end of a winding portion thereof. The magnetic circuit system includes a T-iron, a magnet and a washer, wherein the washer and the magnet are located above the T-iron, a magnetic gap is formed between the washer and the magnet and the T-iron, and the voice coil moves up and down in the magnetic gap. The speaker further comprises an active cooling module fixed to a back of the T-iron, and the active cooling module cools the magnetic circuit system by means of heat conduction.

5 Claims, 3 Drawing Sheets

SPEAKER CAPABLE OF ACTIVE COOLING

CROSS REFERENCE TO RELATED APPLICATIONS

This application claims priority under 35 U.S.C. § 119 to Chinese Patent Application No. CN 201810442554.5, which was filed on May 10, 2018, and which is herein incorporated by reference.

TECHNICAL FIELD

The present invention relates to the technical field of speaker manufacturing, in particular, to a speaker capable of active cooling.

BACKGROUND

Dynamic speakers are the most widely used speakers in the world. As an electroacoustic transducer, the acoustic output efficiency of a dynamic speaker is usually less than 2%, because 90% of the input electrical energy is converted into Joule heat of the speaker voice coil. This heat causes the temperature of the voice coil to rise sharply while heating the entire magnetic circuit system of the speaker (including the washer, magnet and T-iron).

Therefore, the heat dissipation design for the speaker is very important, otherwise it is easy to cause the neodymium magnet to demagnetize at high temperature, and then the voice coil is burnt at high temperature, which severely limits the resistance power of the speaker. Sometimes, in order to increase the resistance power of the speaker, it is forced to use a voice coil and a neodymium magnet with a higher temperature resistance level, but this not only causes a sharp rise in the cost of the speaker, but the power boost in this manner is rather limited.

At present, the methods commonly used in the industry to improve the heat dissipation of speakers mainly include (1) using metal skeletons and drum papers; (2) increasing forced convection, and opening holes in the parts to allow more air to flow through the surface of the voice coil to remove heat; and (3) blackening the magnetic circuit and voice coil to increase radiation efficiency.

However, among the above three methods, (1) when using a metal skeleton and a drum paper, since the internal damping is small, the sound quality is hard, which has a large influence on the sound output; (2) the efficiency of heat dissipation by forcing convection to the voice coil is limited, especially when the heat source is hidden in the speaker, the convection effect is poor; and (3) although blackening the magnetic circuit and the voice coil is beneficial to the heat radiation between the two, the magnetic circuit will rise to a certain temperature quickly, and finally reach the heat balance, then the heat dissipation may not be continued.

Therefore, it is necessary to optimize the design of the existing speaker's heat dissipation system to reduce the overall temperature of the speaker and ensure normal operation.

SUMMARY

In order to solve the above problems existing in the prior art, the present invention provides a speaker provided with an active cooling module adopting a thermoelectric semiconductor cooling sheet attached to the T-iron for active cooling, and further lowers the temperature of the corresponding voice coil heat source after reducing the temperature of the entire magnetic circuit system, and finally reduces the temperature of the entire speaker, thereby improving the limit input power.

To achieve the above object, the present invention provides the following technical solution.

A speaker capable of active cooling, includes a basin frame, and a vibration system and a magnetic circuit system that are accommodated in the basin frame, the vibration system including a diaphragm and a voice coil, the voice coil being fixed on the diaphragm through a top end of a winding portion thereof, the magnetic circuit system including a T-iron, a magnet and a washer, the washer and the magnet being located above the T-iron, a magnetic gap being formed between the washer and the magnet and the T-iron, the voice coil moving up and down in the magnetic gap, characterized by further comprising an active cooling module fixed to a back of the T-iron, and the active cooling module cools the magnetic circuit system by means of heat conduction.

The active cooling module is fixed on the T-iron surface of the magnetic circuit system, forcibly cooling the magnetic circuit system, which is equivalent to the mutual heat exchange between the cold source and the voice coil heat source. By increasing the cooling efficiency of the cold source active cooling module, the temperature of the voice coil and the entire speaker system may be reduced, thereby avoiding the risk of thermal damage of various components due to excessive temperature, thereby increasing the ultimate resistance power of the speaker.

As a further description of the technical solution of the present invention, the active cooling module includes a semiconductor cooling sheet, a fixing member, and a heat sink; the semiconductor cooling sheet is electrically connected to a DC power source, with a cold end being attached to the back surface of the T-iron and a hot end being attached to the heat sink; the fixing member fixes the heat sink and the semiconductor cooling sheet to the T-iron.

The semiconductor cooling sheet is composed of two substrates, and there are N-type and P-type semiconductor material elements in between, and the cooling sheets is required to be connected in series on the DC power source for operation. When a direct current flows from the N-type element to a junction of the P-type element, here a cold end is formed by absorbing heat; when current flows from the P-type element to the joint of the N-type element, here a hot end is formed by releasing heat. The cold end of the semiconductor cooling sheet is attached to the surface of the T-iron, and the hot end thereof is attached to the heat sink. Since the heat sink may effectively dissipate heat at the hot end of the semiconductor cooling sheet, the T-iron may conduct more heat through the contact to the cold end of the cooling sheet. When the temperature of the entire magnetic circuit system is lowered, correspondingly, the temperature of the voice coil heat source may be effectively reduced, thereby achieving the purpose of increasing the limit input power.

As a further description of the technical solution of the present invention, the heat sink is provided with a plurality of heat sink sheets on a side thereof away from the semiconductor cooling sheet.

A plurality of heat sink sheets are disposed on the heat sink to ensure the heat dissipation effect on the hot end of the semiconductor cooling sheet and ensure the cooling efficiency of the cooling sheet.

As a further description of the technical solution of the present invention, the fixing member is a screw so as to ensure a tight connection between the semiconductor cooling sheet and the T-iron surface, and the semiconductor refrigerating sheet and the heat sink for effective thermal contact conduction.

The present invention further provides a sound box of the above speaker capable of active cooling, wherein the sound box has a first opening and a second opening respectively on two longer sides, the basin frame extending a fixing bracket from the top, the basin frame being fixed to the first opening by the fixing bracket; the heat sink is fixed to the second opening, and the heat sink extends from the second opening.

The heat sink sheets of the heat sink dissipate heat to the outside air to effectively dissipate heat for reducing the temperature of the hot end of the semiconductor cooling sheet, ensuring the cooling effect of the semiconductor cooling sheet, and reducing the overall temperature of the speaker.

Further, the present invention further provides a sound box comprising the above speaker capable of active cooling, wherein the sound box has a first opening and a second opening respectively on two longer sides, the basin frame extending a fixing bracket from the top, the basin frame being fixed to the first opening by the fixing bracket; the second opening forms an air duct inwardly, and the air duct is aligned with the heat sink.

When the sound box operates, the air inside and outside the sound box is quickly exchanged heat through an air duct, which is equivalent to adding forced convection to the surface of the heat sink, so that the temperature of the hot end of the cooling sheet may be effectively reduced and the semiconductor cooling sheet is ensured to have a good cooling effect.

Based on the above technical solutions, the technical effects obtained by the present invention are:

(1) The speaker capable of active cooling provided by the present invention adopts a thermoelectric semiconductor cooling sheet attached to the T-iron for active cooling, and further lowers the temperature of the corresponding voice coil hot source after reducing the temperature of the entire magnetic circuit system, avoids thermal damage to the voice coil caused by too high a temperature, which ultimately reduces the overall temperature of the entire speaker and increases the ultimate input power.

(2) The speaker capable of active cooling of the present invention adopts an active cooling module with a small size, and may be made into a refrigerator having a volume of less than 1 cm$^3$, which is light in weight, has no mechanical transmission part, has no noise during operation, and has no working medium of liquid and gas, so that the environment may not be polluted.

(3) In the speaker capable of active cooling of the present invention, the active cooling may effectively reduce the temperature of the magnetic circuit system, avoid the demagnetization problem of the neodymium magnets existing at high temperatures, and at the same time, the neodymium magnet with lower temperature resistance may be selected in the process of preparing the speaker, thereby reducing the production cost.

DETAILED DESCRIPTION

Figure 1:
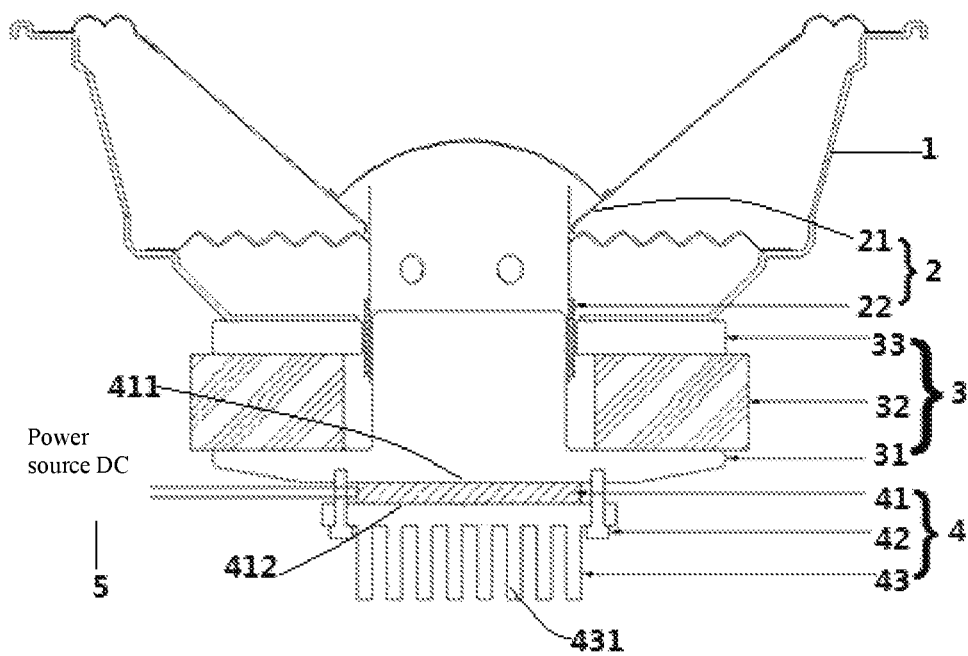
FIG. 1 is a structural view of a speaker capable of active cooling according to the present invention.

In order to facilitate the understanding of the present invention, the present invention will be described more fully hereinafter with reference to the accompanying drawings and specific embodiments. Preferred embodiments of the present invention are shown in the drawings. However, the present invention may be embodied in many different forms and is not limited to the embodiments described herein. Rather, these embodiments are provided so that this disclosure of the present invention will be more fully understood.

It should be noted that when an element is referred to as being "fixed" to another element, it can be directly on the other element or a center element can be present. When an element is referred to as being "connected" to another element, it can be directly connected to the other element or a center element can be present simultaneously.

All technical and scientific terms used herein, unless otherwise defined, have the same meaning as commonly understood by one of ordinary skill in the art to the present invention. The terminology used in the description of the present invention is for the purpose of describing particular embodiments and is not intended to limit the present invention.

Embodiment 1

FIG. 1 is a structural view of a speaker capable of active cooling according to the present invention. As shown in FIG. 1, a speaker capable of active cooling includes a basin frame 1, and a vibration system 2 and a magnetic circuit system 3 that are accommodated in the basin frame 1. The vibration system 2 includes a diaphragm 21 and a voice coil 22. The magnetic circuit system 3 includes a T-iron 31, a magnet 32 and a washer 33. As a heat source of the speaker, the voice coil 22 is fixed to the diaphragm 21 by the top end of a winding portion to vibrate. In the magnetic circuit system 3, the washer 33 and the magnet 32 are located above the T-iron 31, and a magnetic gap is formed between the washer 33 and the magnet 32 and the T-iron 31. The voice coil 22 is configured to move up and down in the magnetic gap. The heat generated when the voice coil is energized causes the temperature of the voice coil 22 to rise. Since the voice coils 22 are close to the magnetic circuit system 3 but are not in contact, the voice coil causes the temperature of the magnetic circuit system to rise by means of thermal radiation.

It should be noted that in the speaker, the active cooling module 4 is fixedly disposed on a back surface of the T-iron 31, and the active cooling module 4 cools the magnetic circuit system 3 by heat conduction.

Figure 2:
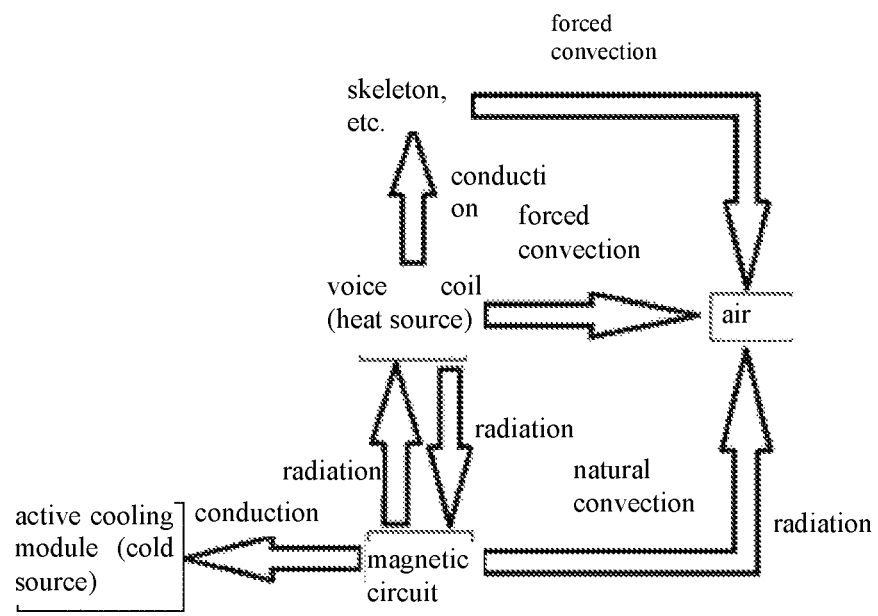
FIG. 2 is a heat conduction model view of a speaker capable of active cooling according to the present invention.

FIG. 2 is a heat conduction model view of a speaker capable of active cooling according to the present invention. As shown in FIG. 2, a part of the heat of the heat source voice coil is transmitted to the basin frame, the skeleton and other components of the speaker by conduction, another part is radiated to the air by forced convection, and the most part is transmitted to the magnetic circuit by means of heat radiation. The heat on the skeleton and magnetic circuit system is also dissipated into the air by convection. However, due to the closed state of the speaker and the sound box, the heat dissipated to the air may not be diffused in time, so there is a problem of local overheating. In the present embodiment, by adding a cold source to the magnetic circuit system: an active cooling module, the active cooling module is fixed on the T-iron surface of the magnetic circuit system, forcibly cooling the magnetic circuit system, which is equivalent to performing mutual heat exchange between the cold source and the voice coil heat source.

Since the electric power input into the speaker is constant, i.e., since the heating power of the heat source voice coil is fixed, when the cooling efficiency of the cold source is increased, the heat of the magnetic circuit system may be transferred to the active cooling module in time, so that the temperature of the voice coil and the entire speaker system may be reduced naturally, thereby avoiding the risk of thermal damage of various components due to excessive temperature, thereby further increasing the ultimate resistance power of the speaker.

Figure 3:
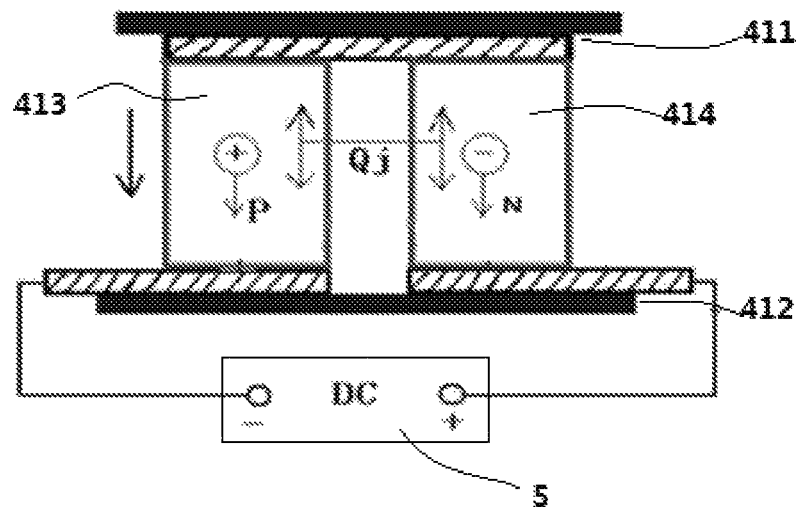
FIG. 3 is a view showing the operation of the semiconductor cooling sheet according to the present invention.

FIG. 3 is a view showing the operation of the semiconductor cooling sheet according to the present invention. With combined reference to FIGS. 1 and 3, the active cooling module includes a semiconductor cooling sheet 41, a fixing member 42, and a heat sink 43. The semiconductor cooling sheet 41 is electrically connected to a DC power source 5 with a cold end 411 being attached to the back surface of the T-iron 31 and a hot end 412 being attached to the heat sink 43. The fixing member 42 fixes the heat sink 43 and the semiconductor cooling sheet 41 to the T-iron 31.

The semiconductor cooling sheet 41 is composed of two ceramic substrates with a P-type semiconductor element 413 and an N-type semiconductor element 414 interposed therebetween. The element material of the P-type semiconductor element 413 and the N-type semiconductor element 414 is germanium. When a current flows from the N-type semiconductor element 414 to a junction of the P-type semiconductor element 413, here a cold end 411 is formed by absorbing heat. When current flows from the P-type semiconductor element 413 to the joint of the N-type semiconductor element 414, here a hot end 412 is formed by releasing heat. The magnitude of the heat absorption and hear releasing is determined by the magnitude of the current and the number of elements of the P-type semiconductor element 413 and the N-type semiconductor element 414.

The cold end 411 of the semiconductor cooling sheet 41 is attached to the surface of the T-iron 31, and the hot end 412 thereof is attached to the heat sink 43. Since the heat sink may effectively dissipate heat at the hot end of the semiconductor cooling sheet, the T-iron may conduct more heat through the contact to the cold end of the cooling sheet. When the temperature of the entire magnetic circuit system is lowered, correspondingly, the temperature of the voice coil heat source may be effectively reduced, thereby achieving the purpose of increasing the limit input power.

In the present embodiment, the thermoelectric semiconductor cooling assembly is used as the active cooling module. The semiconductor cooling sheet of the active cooling module is small in size, and may be made into a refrigerator having a volume of less than 1 cm$^3$, which is light in weight and has a weight ranging from several grams to several tens of grams. Moreover, the active cooling module has no mechanical transmission part, no noise during operation, no working medium of liquid and gas, and thus may not pollute the environment.

The active cooling modules using thermoelectric semiconductor cooling assembly also have the following advantages: its cooling parameters are not affected by the spatial direction and gravity, and it may work normally under large mechanical overload conditions; the cooling rate may be conveniently adjusted by adjusting the working current; it has a fast action, long service life and easy automatic control.

It should be noted that as an alternative, the speaker may also be cooled using an active cooling module based on the thermoacoustic principle (sonic cooling). The working principle is based on the thermoacoustic effect, which is derived from the interaction between the solid medium and the oscillating fluid in the sound field, and the resulted exchange between acoustic energy and thermal energy. The cooling power of the micro thermoacoustic cooling device is about 1 W, and the temperature drop is several tens of degrees when the hot end is at room temperature.

It should be noted that a plurality of heat sink sheets 431 are disposed on a side of the heat sink 43 away from the semiconductor cooling sheet 41 to ensure the heat dissipation effect on the hot end of the semiconductor cooling sheet and ensure the cooling efficiency of the cooling sheet. The fixing member 42 is a screw so as to ensure a tight threaded connection between the semiconductor cooling sheet and the T-iron surface, and the semiconductor refrigerating sheet and the heat sink for effective thermal contact conduction.

The speaker capable of active cooling of the present embodiment adopts a thermoelectric semiconductor cooling sheet attached to the T-iron for active cooling, and further lowers the temperature of the corresponding voice coil hot source after reducing the temperature of the entire magnetic circuit system, avoids thermal damage to the voice coil caused by too high a temperature, which ultimately reduces the overall temperature of the entire speaker and increases the ultimate input power.

In addition, for the speaker, the active cooling may effectively reduce the temperature of the magnetic circuit system, avoid the demagnetization problem of the neodymium magnets existing at high temperatures, and the neodymium magnet with lower temperature resistance may be selected in the process of preparing the speaker, thereby reducing the production cost.

Embodiment 2

Figure 4:
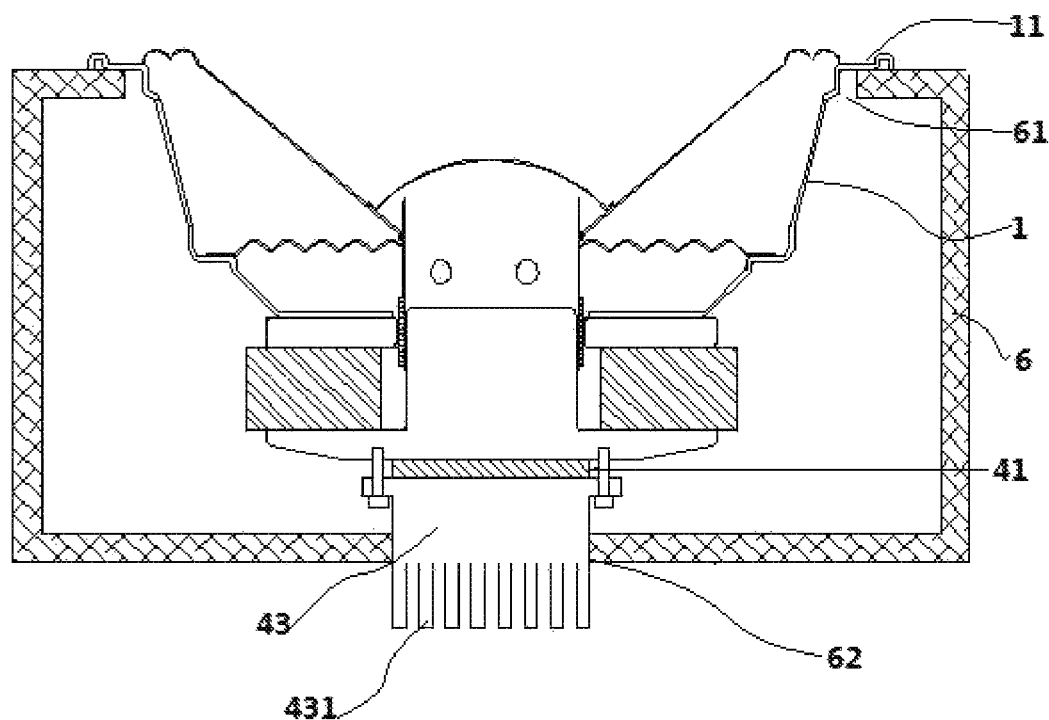
FIG. 4 is a structural view of an embodiment of a sound box having the speaker capable of active cooling according to the present invention.

FIG. 4 is a sound box comprising the speaker capable of active cooling according to the present embodiment. As shown in FIG. 4, the sound box 6 is a closed sound box, and has a first opening 61 and a second opening 62 respectively on two longer sides, wherein the basin frame 1 extends a fixing bracket 11 from the top, the basin frame 1 is fixed to the first opening 61 by the fixing bracket 11, the heat sink 43 is fixed to the second opening 62, and the heat sink sheets 431 of the heat sink 43 extend from the second opening 62. The heat sink sheets dissipate heat to the air outside the sound box to effectively dissipate heat for reducing the temperature of the hot end of the semiconductor cooling sheet, ensuring the cooling effect of the semiconductor cooling sheet 41, and reducing the overall temperature of the speaker.

Embodiment 3

Figure 5:
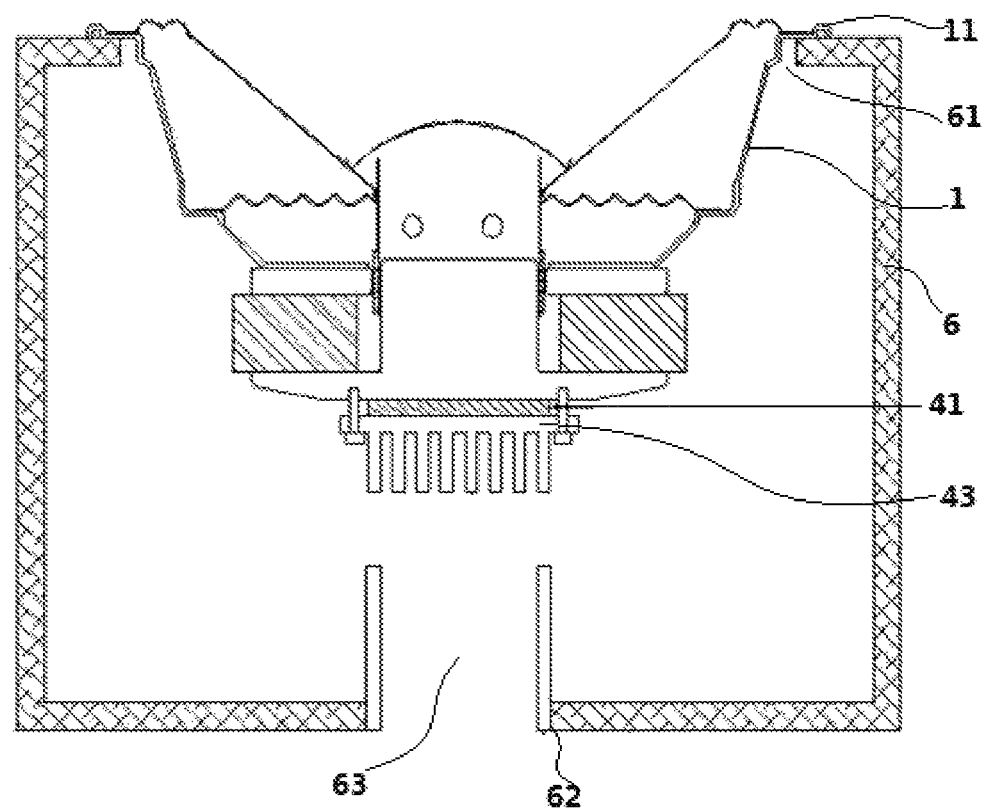
FIG. 5 is a structural view of another embodiment of a sound box having the speaker capable of active cooling according to the present invention.

FIG. 5 is a sound box comprising the speaker capable of active cooling according to another embodiment. As shown in FIG. 5, the sound box 6 is an open sound box, and has a first opening 61 and a second opening 62 respectively on two longer sides, the basin frame 1 extending a fixing bracket 11 from the top, the basin frame 1 being fixed to the first opening 61 by the fixing bracket 11. It should be noted that the second opening 62 forms an air duct 63 inwardly, and the air duct 63 is aligned with the heat sink 43. When the sound box operates, the air inside and outside the sound box is quickly exchanged heat through an air duct 63, which is equivalent to adding forced convection to the surface of the heat sink 43, so that the temperature of the hot end of the cooling sheet 41 may be effectively reduced and the semiconductor cooling sheet is ensured to have a good cooling effect.

The above is only an example and description of the structure of the present invention, and the description thereof is more specific and detailed, but is not to be construed as limiting the scope of the present invention. It should be noted that a number of variations and modifications may be made by those skilled in the art without departing from the spirit and scope of the present invention. These obvious alternatives are within the scope of protection of the present invention.

The invention claimed is:

1. A speaker capable of active cooling, comprising:
    a basin frame;
    a vibration system, accommodated in the basin frame, the vibration system comprising:
        a diaphragm having a winding portion;
        a voice coil fixed on the diaphragm through a top end of the winding portion;
    a magnetic circuit system accommodated in the basin frame, the magnetic circuit system comprising:
        a T-iron;
        a magnet located above the T-iron; and
        a washer located above the T-iron, wherein a magnetic gap is formed between the washer and T-iron and between the magnet and the T-iron;
    a DC power source; and
    an active cooling module fixed to a back of the T-iron, the active cooling module configured to cool the magnetic circuit system by heat conduction, the active cooling module comprising:
        a heat sink;
        a semiconductor cooling sheet electrically connected to the DC power source and having a cold end attached to the back of the T-iron and a hot end attached to the heat sink; and
        a fixing member configured to fix the heat sink and the semiconductor cooling sink to the T-iron,
    wherein the voice coil is configured to move up and down in the magnetic gap.

2. The speaker capable of active cooling according to claim 1, wherein the heat sink comprises a plurality of heat sink sheets on a side of the heat sink away from the semiconductor cooling sheet.

3. The speaker capable of active cooling according to claim 1, wherein the fixing member is a screw.

4. A sound box, comprising:
    the speaker capable of active cooling according to claim 1;
    a first opening; and
    a second opening,
    wherein the basin frame has a fixing bracket extending from a top of the basin frame, the basin frame being fixed to the first opening by the fixing bracket, and
    wherein the heat sink is fixed to and extends from the second opening.

5. A sound box, comprising:
    the speaker capable of active cooling according to claim 1;
    a first opening; and
    a second opening,
    wherein the basin frame has a fixing bracket extending from a top of the basin frame, the basin frame being fixed to the first opening by the fixing bracket, and
    wherein the second opening forms an air duct inwardly, and the air duct is aligned with the heat sink.

* * * * *